(12) United States Patent
Johnson et al.

(10) Patent No.: US 7,505,694 B2
(45) Date of Patent: Mar. 17, 2009

(54) THERMAL CHIRP COMPENSATION SYSTEMS FOR A CHIRP MANAGED DIRECTLY MODULATED LASER (CML™) DATA LINK

(75) Inventors: Bart Johnson, North Andover, MA (US); Daniel Mahgerefteh, Los Angeles, CA (US); Kevin McCallion, Charlestown, MA (US); Zhencan (Frank) Fan, Andover, MA (US); David Piede, Allentown, PA (US); Parviz Tayebati, Weston, MA (US)

(73) Assignee: Finisar Corporation, Sunnyvale, CA (US)

( * ) Notice: Subject to any disclaimer, the term of this patent is extended or adjusted under 35 U.S.C. 154(b) by 597 days.

(21) Appl. No.: 11/120,089

(22) Filed: May 2, 2005

(65) Prior Publication Data

US 2006/0078338 A1    Apr. 13, 2006

Related U.S. Application Data

(63) Continuation-in-part of application No. 10/289,944, filed on Nov. 6, 2002, now Pat. No. 6,963,685, and a continuation-in-part of application No. 10/308,522, filed on Dec. 3, 2002, and a continuation-in-part of application No. 10/680,607, filed on Oct. 6, 2003, now Pat. No. 7,054,538, and a continuation-in-part of application No. 11/068,032, filed on Feb. 28, 2005.

(60) Provisional application No. 60/567,043, filed on Apr. 30, 2004.

(51) Int. Cl.
*H04B 10/04* (2006.01)

(52) U.S. Cl. ........................................ 398/193; 398/201

(58) Field of Classification Search ................ 398/195, 398/199, 201, 193
See application file for complete search history.

(56) References Cited

U.S. PATENT DOCUMENTS

| 3,324,295 | A | 6/1967 | Harris |
| 3,999,105 | A | 12/1976 | Archey et al. |

(Continued)

FOREIGN PATENT DOCUMENTS

| GB | 2 107 147 | 4/1983 |
| WO | 9905804 | 2/1999 |
| WO | 0104999 | 1/2001 |
| WO | 03005512 | 7/2002 |

OTHER PUBLICATIONS

Alexander et al., Passive Equalization of Semiconductor Diode Laser Frequency Modulation, Journal of Lightwave Technology, Jan. 1989, 11-23, vol. 7, No. 1.
Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.
Hyryniewicz, J.V., et al., Higher Order Filter Response in Coupled Microring Resonators, IEEE Photonics Technology Letters, Mar. 2000, 320-322, vol. 12, No. 3.

(Continued)

*Primary Examiner*—Leslie Pascal
(74) *Attorney, Agent, or Firm*—Workman Nydegger

(57) ABSTRACT

A fiber optic communication system for receiving an electronic digital data signal and transmitting the same, comprising an optical signal source adapted to receive the digital data signal and to produce a frequency modulated optical signal from a directly modulated semiconductor laser; an optical spectrum reshaper adapted to convert the frequency modulated optical signal into an amplitude modulated optical signal; and compensation apparatus for compensating for the adverse effects of the thermal chirp normally induced in the frequency modulated optical signal by modulating the semiconductor laser with the electronic digital data signal.

9 Claims, 18 Drawing Sheets

This is a method of implementing the predistortion filter circuit of Figure 9. The High-Speed driver is directly fed to the laser through the laser package's RF port, eliminating driver inefficiencies of the passive compensation circuits. The thermal compensation currents are generated in the low-pass-filter and Voltage-to-current converter. These circuits are active. Since they have limited bandwidth, they can feed to the laser through the bias port of the package as long as the internal inductor is small enough to provide sufficient bandwidth.

U.S. PATENT DOCUMENTS

| | | | |
|---|---|---|---|
| 4,038,600 | A | 7/1977 | Thomas et al. |
| 4,561,119 | A | 12/1985 | Epworth |
| 4,805,235 | A | 2/1989 | Henmi |
| 4,841,519 | A | 6/1989 | Nishio |
| 5,293,545 | A | 3/1994 | Huber |
| 5,325,378 | A | 6/1994 | Zorabedian |
| 5,371,625 | A | 12/1994 | Wedding et al. |
| 5,412,474 | A | 5/1995 | Reasenberg et al. |
| 5,416,629 | A | 5/1995 | Huber |
| 5,465,264 | A * | 11/1995 | Buhler et al. .................. 372/31 |
| 5,477,368 | A | 12/1995 | Eskildsen et al. |
| 5,550,667 | A | 8/1996 | Krimmel et al. |
| 5,592,327 | A | 1/1997 | Gabl et al. |
| 5,737,104 | A | 4/1998 | Lee et al. |
| 5,777,773 | A | 7/1998 | Epworth et al. |
| 5,805,235 | A | 9/1998 | Bedard |
| 5,856,980 | A | 1/1999 | Doyle et al. |
| 5,920,416 | A | 7/1999 | Beylat et al. |
| 5,953,139 | A | 9/1999 | Nemecek et al. |
| 5,974,209 | A | 10/1999 | Cho et al. |
| 6,081,361 | A | 6/2000 | Adams et al. |
| 6,096,496 | A | 8/2000 | Frankel |
| 6,104,851 | A | 8/2000 | Mahgerefteh |
| 6,115,403 | A | 9/2000 | Brenner et al. |
| 6,222,861 | B1 | 4/2001 | Kuo et al. |
| 6,271,959 | B1 * | 8/2001 | Kim et al. .................. 359/325 |
| 6,298,186 | B1 | 10/2001 | He |
| 6,331,991 | B1 * | 12/2001 | Mahgerefteh ................. 372/33 |
| 6,359,716 | B1 | 3/2002 | Taylor |
| 6,473,214 | B1 | 10/2002 | Roberts et al. |
| 6,506,342 | B1 | 1/2003 | Frankel |
| 6,563,623 | B1 | 5/2003 | Penninckx et al. |
| 6,577,013 | B1 | 6/2003 | Glenn et al. |
| 6,618,513 | B2 | 9/2003 | Evankow, Jr. |
| 6,654,564 | B1 | 11/2003 | Colbourne et al. |
| 6,665,351 | B2 | 12/2003 | Hedberg et al. |
| 6,687,278 | B1 | 2/2004 | Mason et al. |
| 6,748,133 | B2 | 6/2004 | Liu et al. |
| 6,778,307 | B2 | 8/2004 | Clark |
| 6,810,047 | B2 | 10/2004 | Oh et al. |
| 6,834,134 | B2 | 12/2004 | Brennan et al. |
| 6,836,487 | B1 | 12/2004 | Farmer et al. |
| 6,847,758 | B1 | 1/2005 | Watanabe |
| 6,947,206 | B2 | 9/2005 | Tsadka et al. |
| 6,963,685 | B2 | 11/2005 | Mahgerefteh et al. |
| 7,013,090 | B2 | 3/2006 | Adachi et al. |
| 7,054,538 | B2 | 5/2006 | Mahgerefteh et al. |
| 7,076,170 | B2 | 7/2006 | Choa |
| 7,123,846 | B2 | 10/2006 | Tateyama et al. |
| 7,263,291 | B2 | 8/2007 | Mahgerefteh et al. |
| 7,280,721 | B2 | 10/2007 | McCallion et al. |
| 2002/0063930 | A1 * | 5/2002 | Blauvelt .................. 359/161 |
| 2002/0154372 | A1 | 10/2002 | Chung et al. |
| 2002/0159490 | A1 | 10/2002 | Karwacki |
| 2002/0176659 | A1 | 11/2002 | Lei et al. |
| 2003/0002120 | A1 | 1/2003 | Choa |
| 2003/0067952 | A1 | 4/2003 | Tsukiji et al. |
| 2003/0099018 | A1 | 5/2003 | Singh et al. |
| 2003/0147114 | A1 | 8/2003 | Kang et al. |
| 2003/0193974 | A1 | 10/2003 | Frankel et al. |
| 2004/0008933 | A1 | 1/2004 | Mahgerefteh et al. |
| 2004/0008937 | A1 | 1/2004 | Mahgerefteh et al. |
| 2004/0036943 | A1 | 2/2004 | Freund et al. |
| 2004/0076199 | A1 | 4/2004 | Wipiejewski et al. |
| 2004/0096221 | A1 | 5/2004 | Mahgerefteh et al. |
| 2004/0218890 | A1 | 11/2004 | Mahgerefteh et al. |
| 2005/0100345 | A1 | 5/2005 | Welch et al. |
| 2005/0111852 | A1 | 5/2005 | Mahgerefteh et al. |
| 2005/0175356 | A1 | 8/2005 | McCallion et al. |
| 2005/0206989 | A1 | 9/2005 | Marsh |
| 2005/0271394 | A1 | 12/2005 | Whiteaway et al. |
| 2005/0286829 | A1 | 12/2005 | Mahgerefteh et al. |
| 2006/0002718 | A1 | 1/2006 | Matsui et al. |
| 2006/0018666 | A1 | 1/2006 | Matsui et al. |
| 2006/0029358 | A1 | 2/2006 | Mahgerefteh et al. |
| 2006/0029396 | A1 | 2/2006 | Mahgerefteh et al. |
| 2006/0029397 | A1 | 2/2006 | Mahgerefteh et al. |
| 2006/0228120 | A9 | 10/2006 | McCallion et al. |
| 2006/0233556 | A1 | 10/2006 | Mahgerefteh et al. |
| 2006/0274993 | A1 | 12/2006 | Mahgerefteh et al. |

OTHER PUBLICATIONS

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutali et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-μm InGaAlAs Multiquantum Well Ridge Waveguide Distributed Feedback Lasers, IEEE Photonics Technology Letters, Oct. 1, 2007, pp. 1436-1438, vol. 19, No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

* cited by examiner

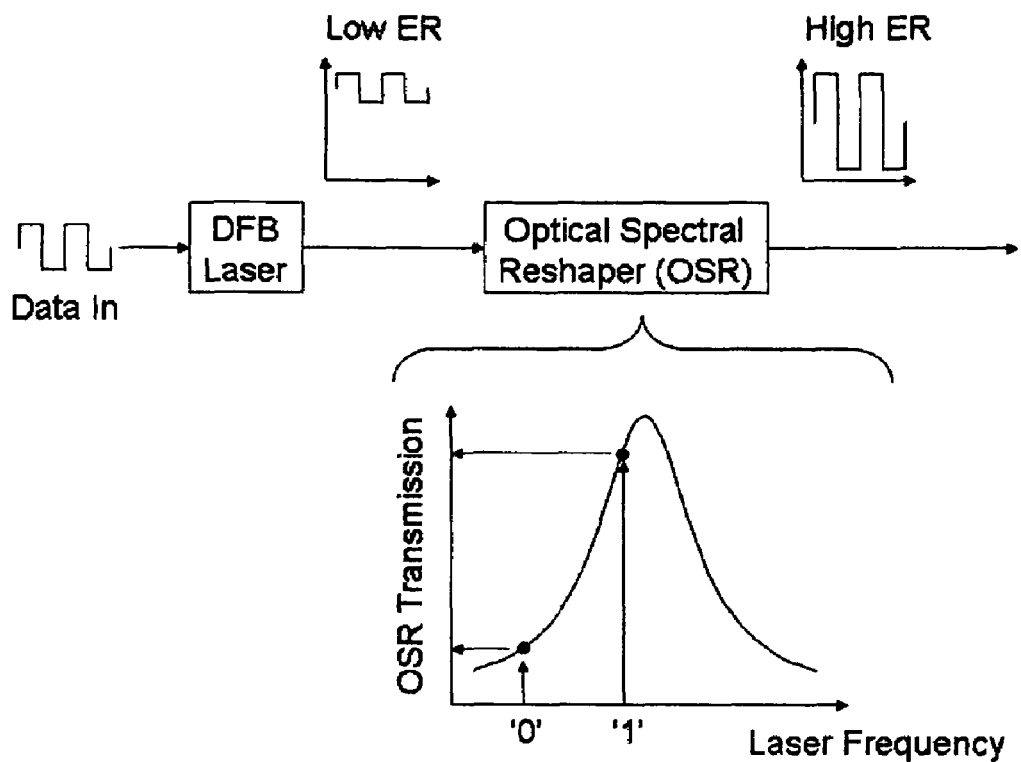
Figure 1. Simple picture of how the laser's adiabatic chirp can be used to increase extinction ratio (ER) by passing the light through an Optical Spectral Reshaper.

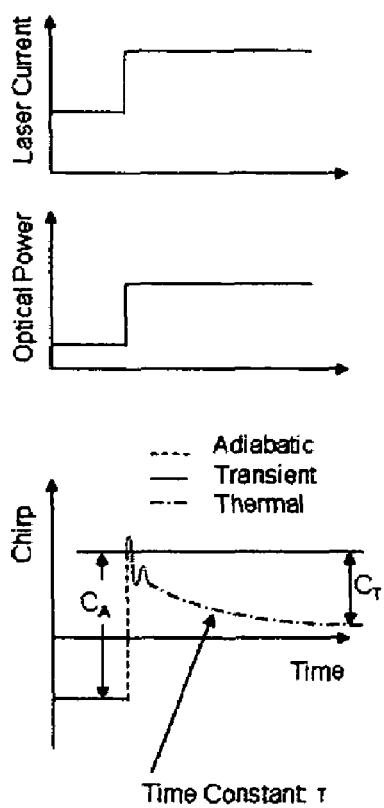
Figure 2. Diagram showing Adiabatic, Transient and Thermal Chirp effects.

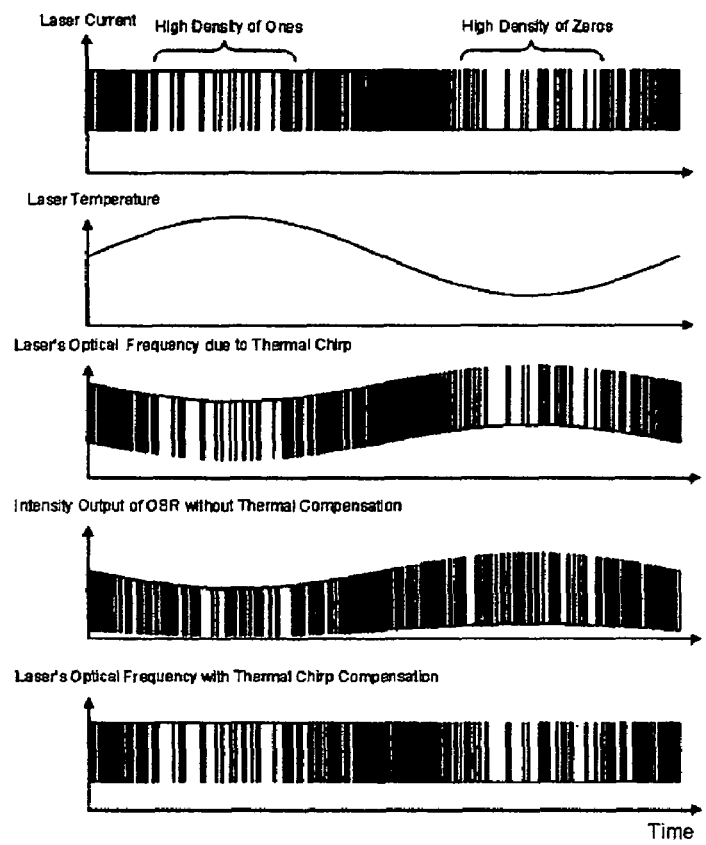
Figure 3. Diagram showing how varying bit densities influence laser temperature and thermal chirp. In turn, the thermal chirp causes wander in the laser/OSR output.

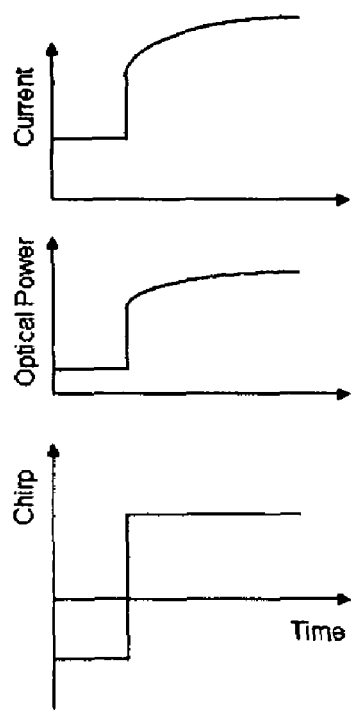
Figure 4. Use of drive current predistortion to compensate the chirp signal.

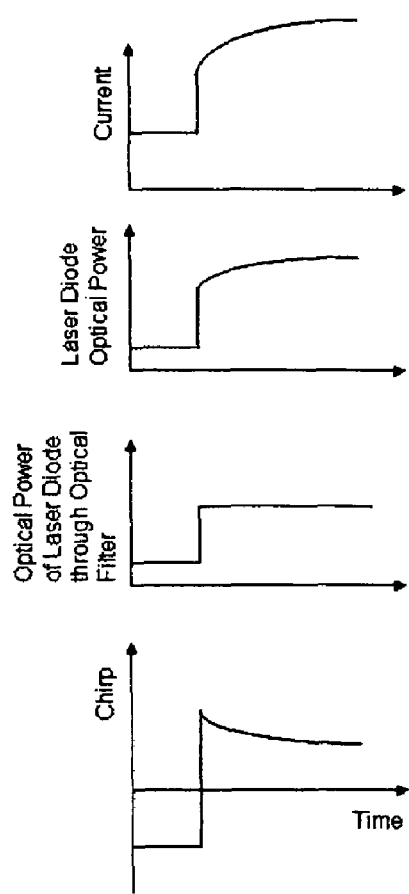
Figure 5. Use of drive current predistortion to compensate the optical power through the optical slope filter.

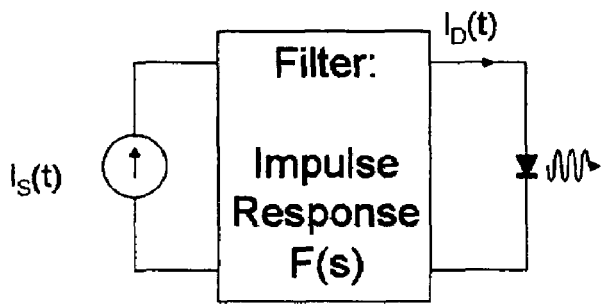
Figure 6. Block diagram of circuit used to predistort the laser current drive to compensate the chirp signal (see Fig. 2). The Laplace Transform of the filter's impulse response is shown in terms of the Adiabatic and Thermal Chirp amplitudes defined in Fig. 1.

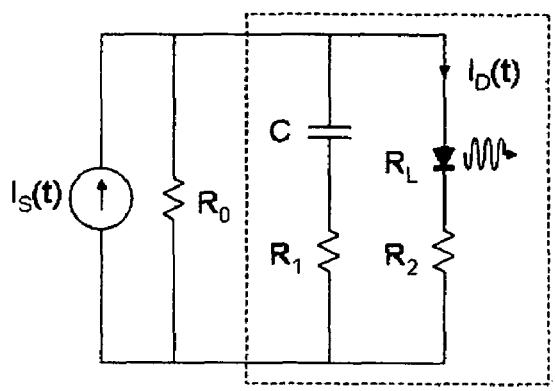

$$F(s) = \frac{I_D(s)}{I_S(s)} = \left(\frac{R_L R_0}{R_L R_0 + R_1 R_0 + R_2 R_0 + R_L R_1 + R_2 R_1}\right) \frac{s + \frac{1}{R_1 C}}{s + \left(\frac{R_1 R_0 + R_L R_1 + R_2 R_1}{R_L R_0 + R_L R_0 + R_2 R_0 + R_L R_1 + R_2 R_1}\right) \frac{1}{R_1 C}}$$

Figure 7. Passive circuit realization of Figure 6's block diagram. The thermal compensation circuit can be designed by equating the expressions for F(s) in Figures 6 and 7. This links thermal and laser chirp parameters (Figure 6) to circuit parameters (Figure 7).

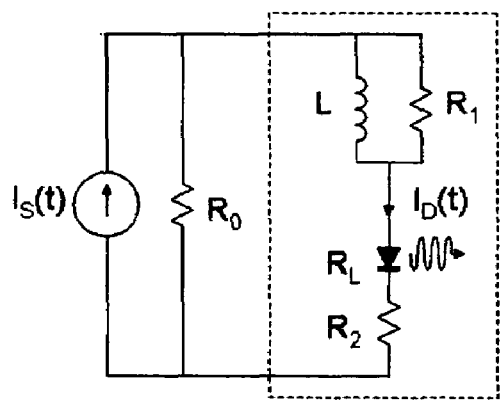
Figure 8. Another passive circuit realization of Figure 6's block diagram. This circuit is equivalent to the one in Figure 7. A parallel R,L combination replaces the series R,C of Figure 7.

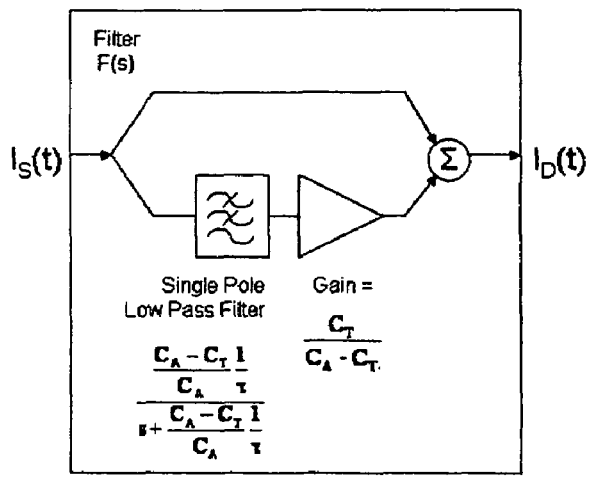

Figure 9. Another method of implementing predistortion for chirp compensation that is equivalent to the filter in Figure 8. The diagram has two parallel paths. In the top arm, the high-speed modulated current is passed directly to the diode laser. The bottom path feeds a low-pass-filtered version of the modulation current into the laser. Thus the laser current is the sum of high- and low-speed signals.

$$F(s) = \frac{I_D(s)}{I_S(s)} = \frac{s + \frac{1}{\tau}}{s + \frac{C_A - C_T}{C_A}\frac{1}{\tau}} = 1 + \frac{\frac{C_T}{C_A}\frac{1}{\tau}}{s + \frac{C_A - C_T}{C_A}\frac{1}{\tau}}$$

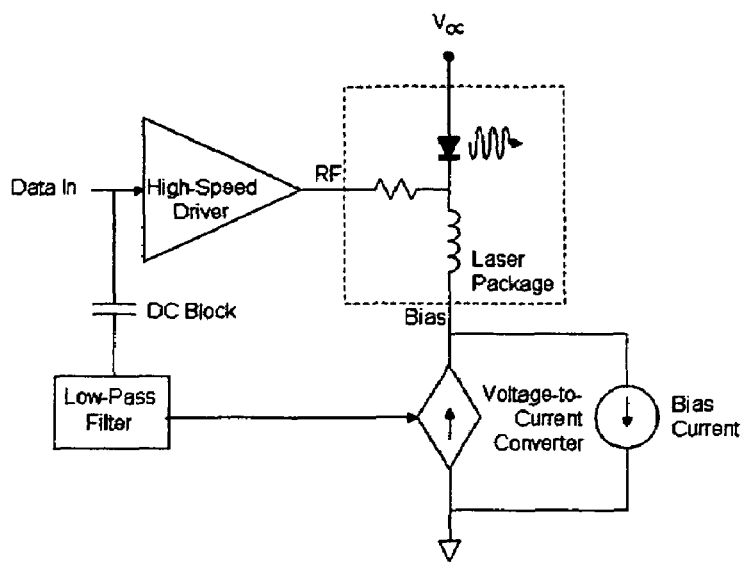

Figure 10. This is a method of implementing the predistortion filter circuit of Figure 9. The High-Speed driver is directly fed to the laser through the laser package's RF port, eliminating driver inefficiencies of the passive compensation circuits. The thermal compensation currents are generated in the low-pass-filter and Voltage-to-current converter. These circuits are active. Since they have limited bandwidth, they can feed to the laser through the bias port of the package as long as the internal inductor is small enough to provide sufficient bandwidth.

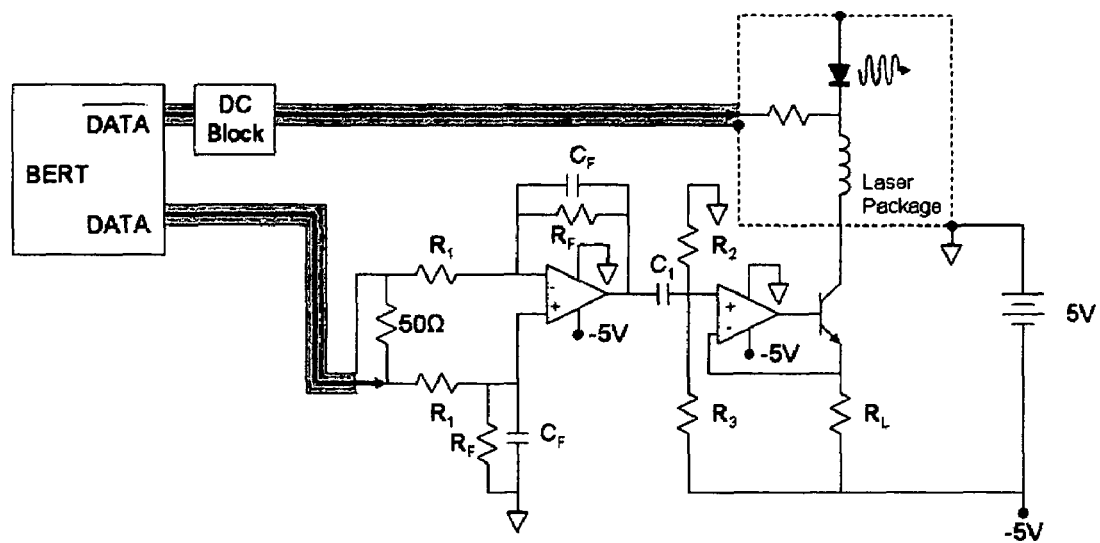
Figure 11. One possible detailed circuit implementation of the diagram in Figure 10.

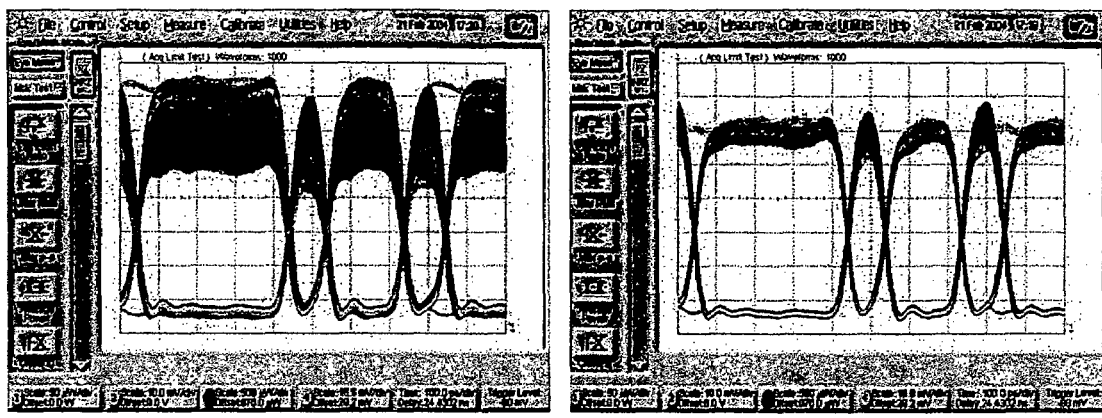
Figure 12. Eye diagram for 192 11110110 bytes followed by 192 00001001 bytes. Left diagram is without feedforward compensation and shows the amplitude changes in the logic 1 level caused by thermal chirp. The diagram on the right shows the correction that can be achieved with feedforward thermal chirp compensation.

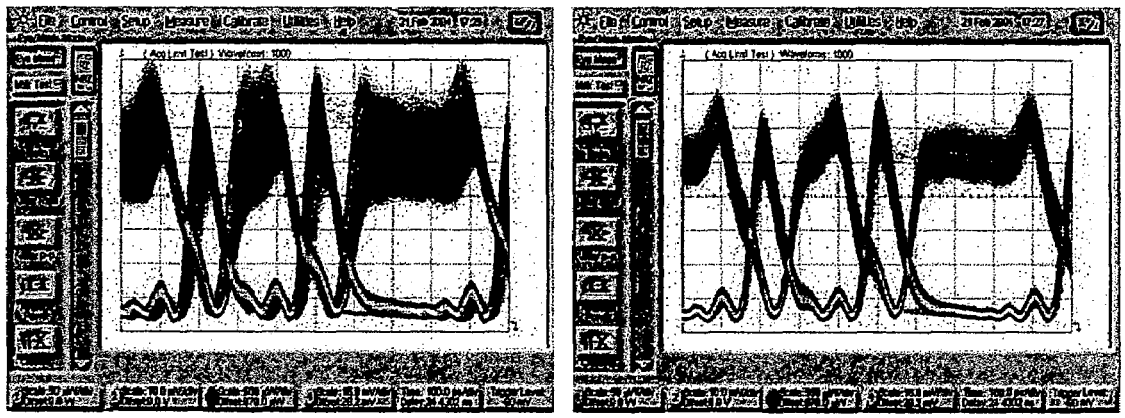

Figure 13. Eye diagram after 100 km of propagation in SMF28 optical fiber for 192 11110110 bytes followed by 192 000010001 bytes. Left diagram is without feedforward compensation and shows the amplitude changes in the logic 1 level caused by thermal chirp as well as thermal chirp induced timing changes. The diagram on the right shows the correction, in amplitude and timing, that can be achieved with feedforward thermal chirp compensation.

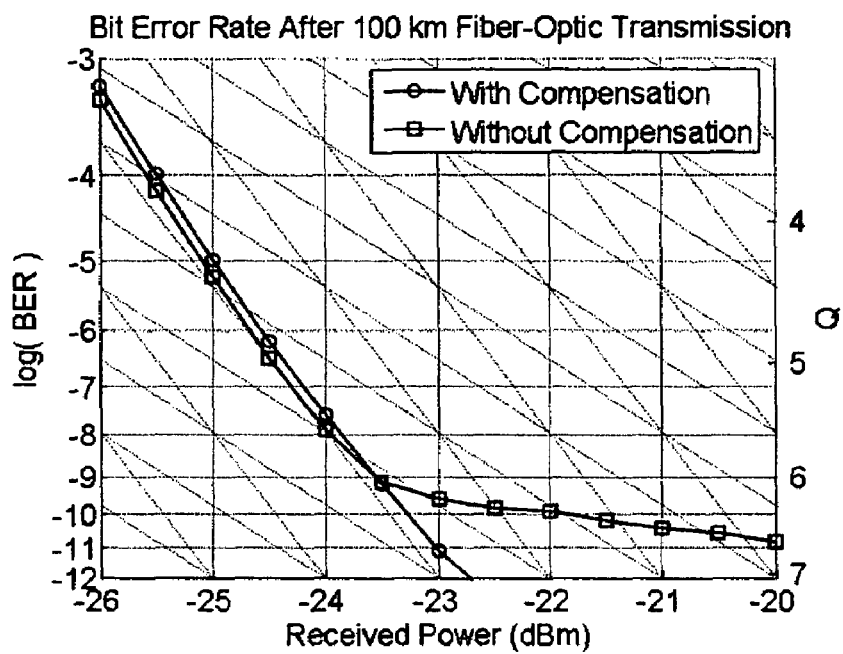
Figure 14. Experimental bit error rate results for CMDM Laser transmitted over 100 km of standard dispersion single mode fiber. Curves show improvement of performance when feedforward compensation is used.

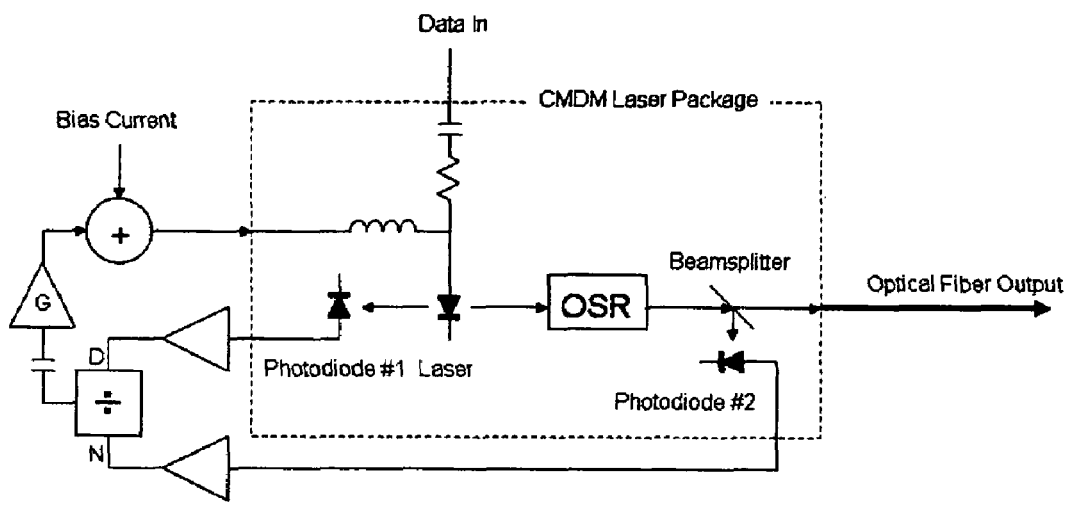
Figure 15. Feedback method of thermal chirp compensation

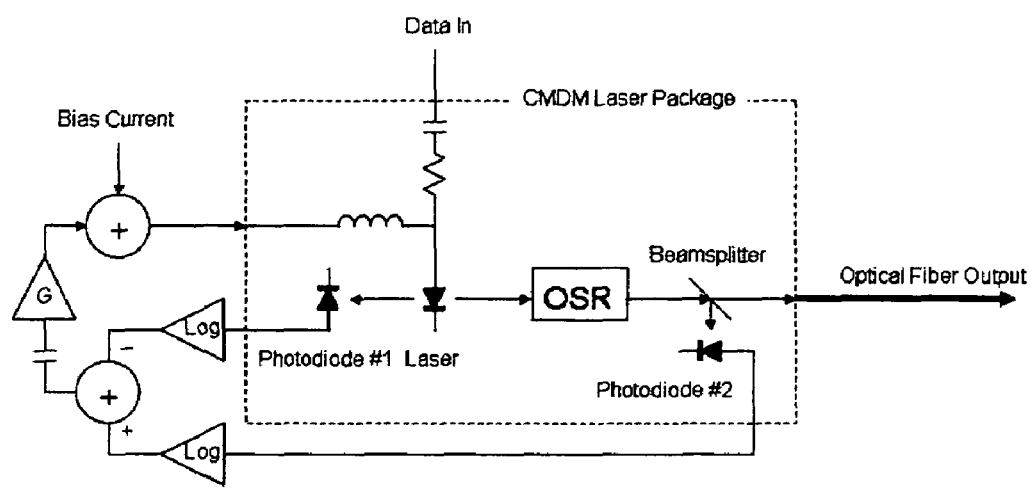
Figure 16. Alternate embodiment of feedback method of thermal chirp compensation using logarithmic feedback

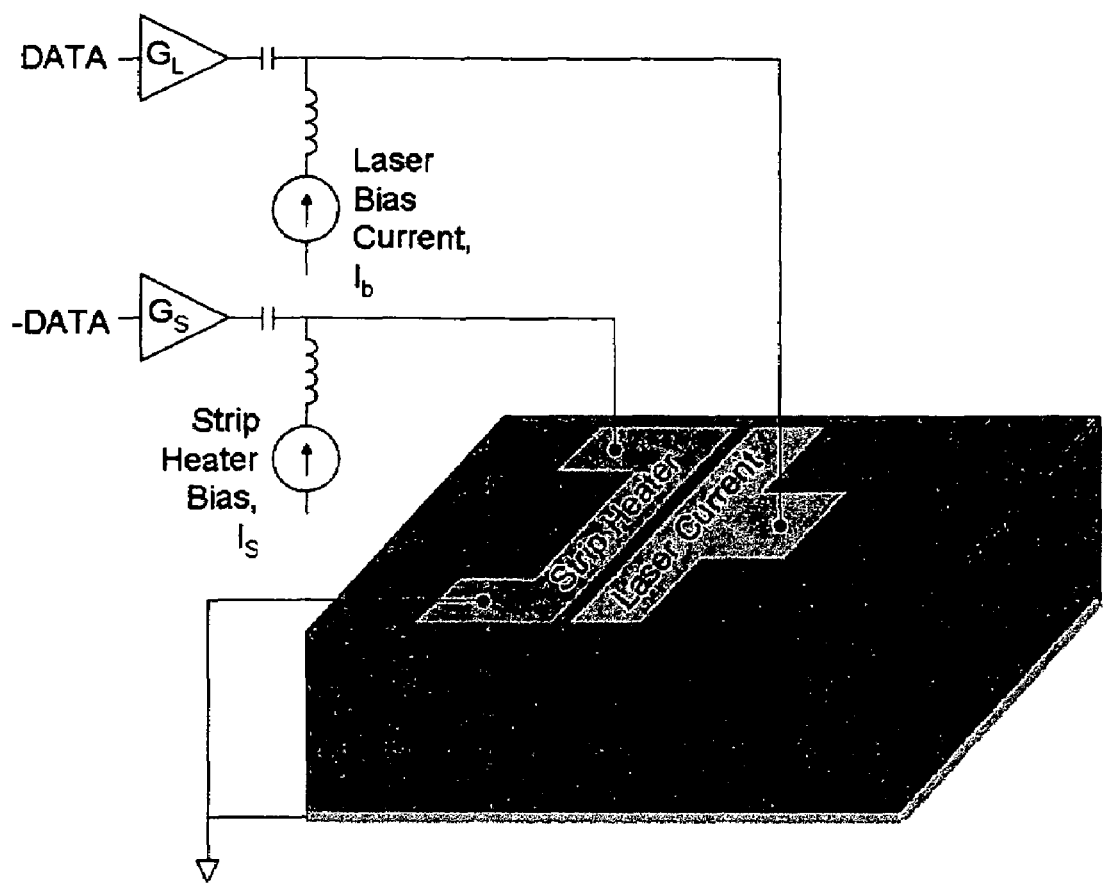
Figure 17. Diagram the diode laser chip with an integrated strip heater

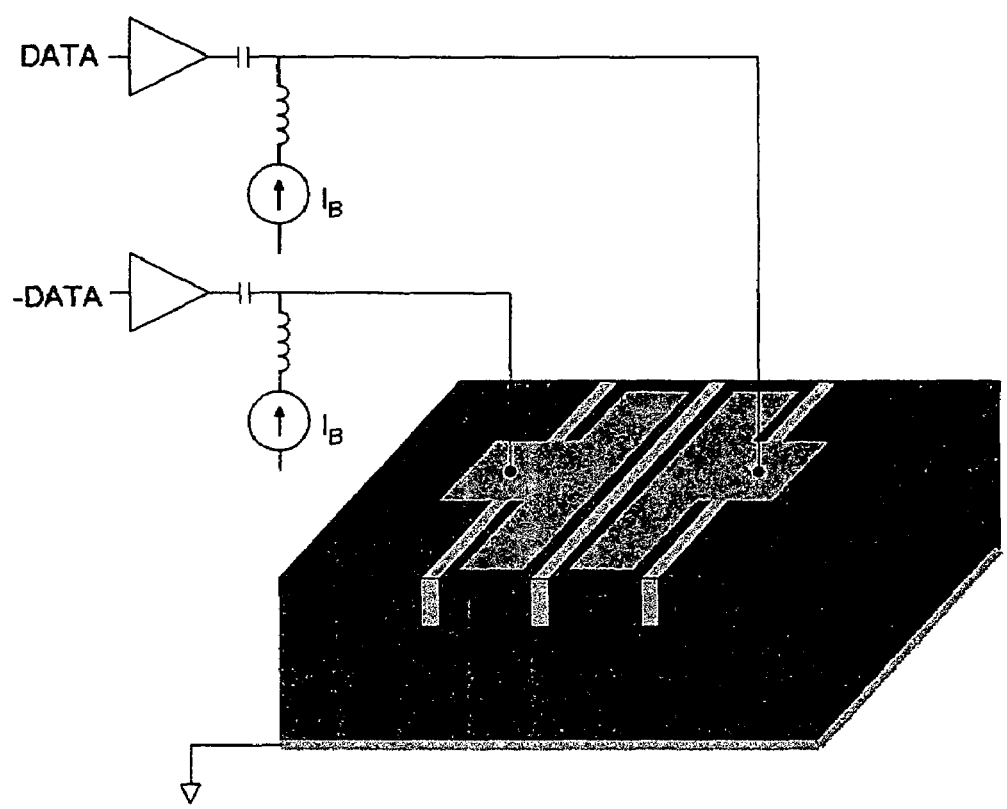
Figure 18. Diagram of push-pull laser where increase in electrical power delivered

THERMAL CHIRP COMPENSATION SYSTEMS FOR A CHIRP MANAGED DIRECTLY MODULATED LASER (CML™) DATA LINK

REFERENCE TO PENDING PRIOR PATENT APPLICATIONS

This patent application:

(i) is a continuation-in-part of pending prior U.S. patent application Ser. No. 10/289,944, filed Nov. 6, 2002 now U.S. Pat. No. 6,963,685 by Daniel Mahgerefteh et al. for POWER SOURCE FOR A DISPERSION COMPENSATION FIBER OPTIC SYSTEM;

(ii) is a continuation-in-part of pending prior U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR;

(iii) is a continuation-in-part of pending prior U.S. patent application Ser. No. 10/680,607, filed Oct. 6, 2003 now U.S. Pat. No. 7,054,538 by Daniel Mahgerefteh et al. for FLAT DISPERSION FREQUENCY DISCRIMINATION (FDFD);

(iv) is a continuation-in-part of pending prior U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT; and (v) claims benefit of pending prior U.S. Provisional Patent Application Ser. No. 60/567,043, filed Apr. 30, 2004 by Bart Johnson et al. for THERMAL CHIRP COMPENSATION SYSTEMS FOR A CHIRP MANAGED DIRECTLY MODULATED (CMDM) LASER DATA LINK;

The five above-identified patent applications are hereby incorporated herein by reference.

FIELD OF THE INVENTION

This invention relates to signal transmissions in general, and more particularly to the transmission of optical signals.

BACKGROUND OF THE INVENTION

A system for long-reach lightwave data transmission through optical fibers has been described in U.S. patent application Ser. No. 10/289,944, filed Nov. 6, 2002 by Daniel Mahgerefteh et al. for POWER SOURCE FOR A DISPERSION COMPENSATION FIBER OPTIC SYSTEM, which patent application is hereby incorporated herein by reference. This system uses an Optical Spectral Reshaper (OSR) to increase the extinction ratio at the output of a frequency modulated source, such as a directly modulated distributed feedback (DFB) diode laser, and reshapes the spectrum so as to increase the error-free transmission beyond the dispersion limit. An Optical Spectral Reshaper (OSR) is an optical element for which the transmission is a function of optical frequency. An OSR can alter the amplitude modulation of an input frequency modulated signal as well as alter the frequency profile of an input amplitude modulated signal. The transmitter described above is sometimes called a Chirp Managed Laser (CML™) by Azna LLC of Wilmington, Mass. The CML™ of Azna LLC has achieved error free transmission at 10 Gb/s through 200 km of single mode fiber having 3400 ps/nm dispersion.

The scheme for increasing the extinction ratio is shown in FIG. 1. Digital modulation of the laser changes its light output intensity, but also changes the optical frequency of its light output. This causes the 1 bit to be blue-shifted relative to the 0 bits. Since the transmission of the OSR is higher for higher frequencies near the edge of its transmission, the extinction ratio of the light passing through the OSR is increased when the spectrum of the laser output is aligned to be near the transmission edge of the OSR. This description assumes that the optical frequency shift is proportional to the light output of the laser, a frequency shift with this property is sometimes called "adiabatic chirp". However, as shown below, a laser has other types of chirp which may cause distortions of the optical output from the desired waveform.

A directly current modulated laser diode, such as a DFB laser, exhibits three types of frequency modulation, or chirp, which accompany the intensity modulation: (1) adiabatic chirp; (2) transient chirp; and (3) thermal chirp. FIG. 2 shows these three types of chirp in relation to the modulated current applied to the laser and the output light intensity in FIG. 2.

The adiabatic chirp, which is proportional to the light intensity, is desirable and is central to the intensity shaping effect of the OSR.

The transient chirp, which has a short-term damped oscillatory behavior, and occurs at the 1-to-0 and 0-to-1 bit transitions, is usually undesirable, but can be controlled to manageable levels through proper biasing of the laser and proper selection of the filter bandwidth.

Thermal chirp is generally undesirable. It has the opposite sign to adiabatic chirp; i.e., an increase in current generates a blue-shifted adiabatic chirp, while it generates a red-shifted thermal chirp. In addition, while adiabatic chirp is nearly instantaneous and follows the output intensity, thermal chirp has a delayed response to the applied current, which increases exponentially in time. Thermal chirp is controlled by several time constants, which are relatively long in duration compared to the typical bit period of high speed digital signals, i.e., 100 ps for 10 Gb/s. The fastest time constant for thermal chirp is on the order of 25 ns for a typical DFB laser chip.

FIG. 3 shows an example of the output intensity and optical frequency of a directly modulated laser in response to modulation with a random digital bit sequence. Here only adiabatic and thermal chirp effects are included; transient chirp has been omitted. Thermal chirp is affected by the mark density of the bit sequence. For the purposes of this disclosure, mark density is the ratio of the number of 1s to the number of 0s that occur in a time period much longer than the bit period. For a truly random digital sequence, the mark density is ½ when averaged over a long period of time (e.g., seconds). However the sequence may have segments in time where the local mark density, measured over a shorter period (e.g., nanoseconds) is higher or lower than the average ½. When a DFB laser is modulated by a random sequence, a high density of 1's will tend to heat the laser since the average injection current is increased.

The temperature of the active region of the laser will decrease for a high density of 0s. The laser frequency changes with change in temperature because the refractive index of the semiconductor material is a function of temperature. Hence the temperature of the laser and its optical frequency tend to wander over time in response to short term changes in the mark density of the random sequence. The OSR converts this frequency wander to amplitude wander. Hence, thermal chirp causes the amplitude of the 1 and 0 bits to change slowly at the output of the CML™ depending on the mark density of the applied sequence. Hence, thermal chirp is generally undesirable in these systems.

This frequency wander can also cause another deleterious effect in data links with long lengths of optical fiber. Since the fiber is dispersive (i.e., since the velocity of light in the fiber varies with optical frequency), the frequency wander caused by thermal chirp can cause variations in the arrival time of the bits at the receiver. For normally dispersive fiber (i.e., positive dispersion), bits following a high density of is will arrive a little late because of the red shift induced by laser heating. On the other hand, bits following a high density of 0s will arrive a little early because of the blue shift induced by laser cooling. In other words, thermal chirp induces a pattern-dependent timing jitter in data links containing long lengths of dispersive fiber.

SUMMARY OF THE INVENTION

The present invention provides techniques to compensate for the adverse effects of thermal chirp. Three techniques of compensation are disclosed: (1) feed-forward compensation applied to the laser injection current; (2) feedback applied to the laser injection current; and (3) direct thermal compensation.

The feed-forward technique is an electronic approach. It works by supplying an additional correction current to the laser, which generates an additional adiabatic chirp component to compensate for thermal chirp. The feed-forward correction current is electronically synthesized from the incoming electrical data used to modulate the laser.

The feedback scheme also compensates for thermal chirp with adiabatic chirp through additional laser current injection. However, in this approach, the feedback correction current is determined by monitoring the optical signal after the OSR. The feedback technique essentially monitors the thermal chirp directly and applies appropriate feedback.

In the direct thermal compensation technique, a feed-forward type circuit is used to keep the temperature of the active region constant, independent of the mark density of the modulating bit sequence. The correction current is supplied to a heater, which is integrated with the laser chip and functions to change the chip temperature. The feed-forward correction signal is generated from the digital data modulating the laser. The direct thermal approach has the advantage that changes in laser temperature result in a pure frequency modulation without affecting output amplitude.

In another form of the invention, there is provided a fiber optic communication system for receiving an electronic digital data signal and transmitting the same, comprising:

an optical signal source adapted to receive the digital data signal and to produce a frequency modulated optical signal from a directly modulated semiconductor laser;

an optical spectrum reshaper adapted to convert the frequency modulated optical signal into an amplitude modulated optical signal; and compensation apparatus for compensating for the adverse effects of the thermal chirp normally induced in the frequency modulated optical signal by modulating the semiconductor laser with the electronic digital data signal.

In another form of the invention, there is provided a fiber optic communication system for receiving an electronic digital data signal and transmitting the same, comprising:

an optical signal source adapted to receive the digital data signal and to produce a frequency modulated optical signal from a directly modulated semiconductor laser; and an optical spectrum reshaper adapted to convert the frequency modulated optical signal into an amplitude modulated optical signal;

wherein the semiconductor laser is configured so that the adiabatic chirp per unit of modulating current exceeds the thermal chirp per unit of modulating current over an operative range of frequencies.

In another form of the invention, there is provided a fiber optic communication system for receiving an electronic digital data signal and transmitting the same, comprising:

an optical signal source adapted to receive the digital data signal and to produce a frequency modulated optical signal from a directly modulated semiconductor laser;

an optical spectrum reshaper adapted to convert the frequency modulated optical signal into an amplitude modulated optical signal; and an electronic circuit adapted to modify the electronic digital data signal so as to additionally modulate the frequency modulated optical signal whereby to reduce the variations in the amplitude of the 1 and 0 logic levels in the amplitude modulated optical signal.

In another form of the invention, there is provided a fiber optic communication system for receiving an electronic digital data signal and transmitting the same, comprising:

an optical signal source adapted to receive the digital data signal and to produce a frequency modulated optical signal from a directly modulated semiconductor laser;

an optical spectrum reshaper adapted to convert the frequency modulated optical signal into an amplitude modulated optical signal; and an electronic circuit to modify the electronic digital data signal to additionally modulate the optical source, wherein the electronic circuit is adapted to compensate for the thermally induced frequency variations of the optical signal source.

In another form of the invention, there is provided a semiconductor laser with two active regions thermally coupled to one another so that when the two active regions are electrically driven with modulation currents of opposite signs, heating in one region is counteracted by cooling in the other, so as to keep the two active regions of the semiconductor laser at a substantially constant temperature in order to reduce the effects of thermal chirp.

In another form of the invention, there is provided a method for transmitting an electronic digital data signal through a fiber optic communication system, comprising:

modulating an optical signal source with a digital data signal so as to produce a frequency modulated optical signal from a directly modulated semiconductor laser;

converting the frequency modulated optical signal into an amplitude modulated optical signal with an optical spectrum reshaper; and compensating for the adverse effects of the thermal chirp normally induced in the frequency modulated optical signal by modulating the semiconductor laser with the electronic digital data signal.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein:

FIG. 1 is a schematic illustration showing how the laser's adiabatic chirp can be used to increase the extinction ratio (ER) by passing the light through an Optical Spectral Reshaper (OSR);

FIG. 2 is a schematic illustration showing adiabatic, transient and thermal chirp effects;

FIG. 3 is a schematic illustration showing how varying bit densities influence laser temperature and thermal chirp, in turn, the thermal chirp causes wander in the laser/OSR output;

FIG. 4 is a schematic illustration showing the use of drive current pre-distortion to compensate for thermal chirp;

FIG. 5 is a schematic illustration showing the use of drive current pre-distortion to compensate the transmitter's optical power through the optical slope filter;

FIG. 6 is a schematic illustration showing a block diagram for a circuit used to pre-distort the laser current drive to compensate for thermal chirp, the Laplace Transform of the filter's impulse response is shown in terms of the adiabatic and thermal chirp amplitudes;

FIG. 7 is a schematic illustration showing a passive circuit realization of the block diagram of FIG. 6, the thermal compensation circuit can be designed by equating the expressions for F(s) in FIGS. 6 and 7, this links the thermal and laser chirp parameters (FIG. 6) to circuit parameters (FIG. 7);

FIG. 8 is a schematic illustration showing another passive circuit realization of the block diagram of FIG. 6, this circuit is equivalent to the one in FIG. 7, however, a parallel R,L combination replaces the series R,C of FIG. 7;

FIG. 9 is a schematic illustration showing another method of implementing pre-distortion for chirp compensation that is equivalent to the filter in FIG. 6, the diagram has two parallel paths, in the top arm, the high-speed modulated current is passed directly to the diode laser, while the bottom path feeds a low-pass-filtered version of the modulation current into the laser, thus the laser current is the sum of high-speed and low-speed signals;

FIG. 10 is a schematic illustration showing a method of implementing the pre-distortion filter circuit of FIG. 9, wherein the high-speed driver is directly fed to the laser through the laser package's RF port, eliminating driver inefficiencies of the passive compensation circuits, and wherein the thermal compensation currents are generated in the low-pass-filter and voltage-to-current converter—these circuits are active, and since they have limited bandwidth, they can feed to the laser through the bias port of the package as long as the internal inductor is small enough to provide sufficient bandwidth;

FIG. 11 is a schematic illustration showing one possible detailed circuit implementation of the diagram in FIG. 10;

FIG. 12 is a schematic illustration showing the eye diagram for 192 11110110 bytes followed by 192 00001001 bytes, where the left diagram is without feed-forward compensation and shows the amplitude changes in the logic "1" level caused by thermal chirp, and where the diagram on the right shows the correction that can be achieved with feed-forward thermal chirp compensation;

FIG. 13 is a schematic illustration showing the eye diagram after 100 km of propagation in SMF28 optical fiber for 192 11110110 bytes followed by 192 00001001 bytes, where the left diagram is without feed-forward compensation and shows the amplitude changes in the logic "1" level caused by thermal chirp as well as thermal chirp induced timing changes, and where the diagram on the right shows the correction, in amplitude and timing, that can be achieved with feed-forward thermal chirp compensation;

FIG. 14 is a schematic illustration showing experimental bit error rate results for a CMDM Laser transmitted over 100 km of standard dispersion single mode fiber, where the curves show improvement of performance when feed-forward compensation is used;

FIG. 15 is a schematic illustration showing the feedback scheme for thermal chirp compensation;

FIG. 16 is a schematic illustration showing an alternate embodiment for the feedback scheme for thermal chirp compensation using logarithmic feedback;

FIG. 17 is a schematic illustration of a diode laser chip with an integrated strip heater for thermal compensation; and FIG. 18 is a schematic illustration showing a push-pull laser where an increase in electrical power delivered to one side is compensated for by a decrease in electrical power delivered to the other side—since the two laser waveguides are in intimate thermal contact with one another, there is no net change in temperature, thereby eliminating thermal chirp.

DETAILED DESCRIPTION OF THE PREFERRED EMBODIMENTS

Thermal Chirp Compensation By The Feed-Forward Technique

The feed-forward approach of thermal chirp compensation is essentially an electronic equalization technique. Alexander et al. (S. B. Alexander, D. Welford, D. vL. Marquis, "Passive Equalization of Semiconductor Diode Laser Frequency Modulation," J. Lightwave Technology, vol. 7, no. 1, pp 11-23, January 1989) described an electronic equalization system for purely frequency-modulated lasers. Their technique was meant for free-space communications applications which do not suffer from dispersion. This prior art was only concerned with correcting the frequency modulation of the laser.

The present invention, on the other hand, is tailored for the CML™ laser transmitter, for which the combination of AM and FM modulation need to be corrected. The method disclosed in the present invention can be adapted to equalize either the FM or AM output of the CML™. This is an important aspect for fiber-optic transmission where dispersion is important.

Given an ideal "step" input, as shown in FIG. 2, the feed-forward circuit distorts (i.e., deliberately modifies) the drive current to the DFB laser so as to generate a step response at the output of the DFB; either output chirp or amplitude after the OSR can be corrected.

FIG. 4 shows the case where the pre-distortion (from the feed-forward circuit) generates an ideal step-like chirp.

FIG. 5 shows the case where the pre-distortion circuit generates an ideal step response after the OSR. For high data rate signals, such as 10 Gb/s and 2.5 Gb/s, the bit lengths are much shorter than the thermal time constant. Therefore, a circuit that corrects the step response of the CML™ over the relatively long time constants of thermal chirp (e.g., tens of nanoseconds) compensates for a random sequence of bits at high bit-rate data.

FIG. 6 shows a block diagram for a pre-distortion circuit that corrects for the effects of thermal chirp. This circuit is essentially an electrical filter; it converts a square wave input current to a square wave laser chirp as shown in FIG. 4.

Equation 1 (below) describes the frequency response of the electrical correction filter. Here $I_S(t)$ is the output of the laser current driver, which would be a random bit pattern in a digital communication system, and F(s) is the Laplace transform of the filter's impulse response. As shown in FIG. 2, $C_A$ is the laser's adiabatic chirp efficiency in GHz/mA, $C_T$ is the thermal chirp efficiency in GHz/mA, τ is the thermal time constant, and A is a scaling constant.

$$F(s) = \frac{I_D(s)}{I_S(s)} = A \cdot \frac{s + \frac{1}{\tau}}{s + \frac{C_A - C_T}{C_A} \frac{1}{\tau}} \quad \text{(Eq. 1)}$$

This electrical filter is appropriate for thermal chirp where $C_A > C_T$; i.e., the magnitude of the adiabatic chirp efficiency must be higher than the magnitude of the thermal chirp efficiency. It is, therefore, an embodiment of the present invention that a laser selected for use in a CML™ has an adiabatic chirp efficiency that is higher than it thermal chirp efficiency. Not all lasers satisfy this criterion. However, it is possible to design the laser so that it meets this criterion.

In the case where $C_T > C_A$, approximate compensation can still be achieved if the duration of the thermal disturbance is less than the time required for the thermal effect to overtake the adiabatic effect.

A physical realization of the functional diagram of the circuit in FIG. 6 is shown in FIG. 7. This implementation is in the form of a passive circuit. The dotted line in FIG. 7 shows the circuits inside the laser package. Here $R_0$ is the output impedance of the current source. When a step current is applied as $I_S(t)$, the capacitor initially shunts current through $R_1$. On a longer time scale, the capacitor charges up and all of the current into the laser package flows through the laser diode. The transfer function for this circuit is $$F(s) = \frac{I_D(s)}{I_S(s)} = \left( \frac{R_1 R_0}{R_1 R_0 + R_L R_0 + R_2 R_0 + R_L R_1 + R_2 R_1} \right) \quad \text{(Eq. 2)}$$
$$\frac{s + \frac{1}{R_1 C}}{s + \left( \frac{R_1 R_0 + R_L R_1 + R_2 R_1}{R_1 R_0 + R_L R_0 + R_2 R_0 + R_L R_1 + R_2 R_1} \right) \frac{1}{R_1 C}}$$

Equations 1 and 2 have the same functional form, within a multiplicative constant. The passive circuit can be designed by equating Equations 1 and 2 and to determine the appropriate values of the circuit elements.

A second realization of the passive circuit of the block diagram of FIG. 6 is shown in FIG. 8. Circuit element values can be selected by deriving F(s) for this network and equating it to Equation 1.

A drawback of the passive circuits in FIGS. 7 and 8 is that they effectively reduce the drive current to the laser. In the case of the circuit shown in FIG. 7, for example, the high-frequency modulation to the laser is reduced by a factor of $$\frac{R_1 R_0}{R_1 R_0 + R_L R_0 + R_2 R_0 + R_L R_1 + R_2 R_1}$$

This means that the high-speed current drive supplying $I_S(t)$ must be increased by the inverse of this factor to support thermal chirp compensation. This is a significant penalty, since high-current high speed (e.g., 10 Gb/s) current drivers are expensive (and bulky, and have a high power consumption) for lasers requiring large drive currents and a large amount of thermal compensation.

The problem here is that these passive circuits cannot amplify the signal. An active circuit is therefore desirable.

FIG. 9 shows an active circuit implementation of the pre-distortion electrical correction filter. Un-attenuated modulation current is sent to the laser through the top path in the filter (FIG. 9). The thermal correction current, generated by a low pass electrical filter and electrical amplifier, is sent through the laser in the lower path. The thermal correction current has a much lower bandwidth than the modulation current, so it can be routed to the bias port of the laser, while the wide-band modulation current is sent directly into the RF port (see FIG. 10).

A more detailed implementation of the diagram in FIG. 10 is shown in FIG. 11.

FIG. 12 shows an example of the benefits of feed-forward thermal chirp compensation using measured data. This figure shows an eye diagrams obtained at the output of a CML™ transmitter, with and without the compensation circuit activated, for a pattern consisting of 192 11110110 bytes followed by 192 00001001 bytes. An eye diagram is one representation of a digital bit sequence in which all the bits are overlapped in time using a common clock as the trigger. Most commonly encountered data patterns have an average mark density of 50%, i.e., 50% of the bits are one bits and the other 50% are 0 bits. Thermal chirp manifests itself most when the mark density deviates from the average 50%. The pattern used in FIG. 12 has a 75% mark density for the first 192 bytes and a 25% mark density for the second 192 bytes. This pattern then repeats. At 10 Gb/s, this causes the laser to alternately heat for 154 ns and cool for 154 ns, thereby causing a severe thermal chirp problem. We therefore use this as a worst case stress pattern to demonstrate the utility of the thermal chirp compensation circuit. The left image in FIG. 12 shows the variation in the logic "1" level as the laser heats and cools; this is the thickening observed in the 1s level. The right image in FIG. 12 shows the improvement of the eye when the feed-forward thermal chirp compensation circuit is activated.

FIG. 13 shows eye diagrams for data transmitted with a CML™ laser through 100 km of standard dispersion single mode fiber, with and without the use of the feed-forward thermal chirp compensation. The same stress pattern is used. Note that the thermally induced timing jitter, caused by thermal chirp in conjunction with the fiber "group velocity dispersion", is reduced. The timing jitter can be seen as the thickening of the transitions between the 1 and 0 bits in the eye diagram. The variation of the logic "1" level is also reduced when feed-forward compensation is used.

An important benefit of thermal chirp compensation is that it reduces the bit error rate. FIG. 14 shows that the bit error rate for the output of a CML™ laser after propagation through 100 km of standard fiber is reduced by activating the feed-forward compensation circuit. Without such compensation, there is a minimum bit error rate of $10^{-10}$; this is called an error floor and is generally not desirable in a communication system. With the feed-forward circuit, the error floor is lowered and bit error rate is reduced.

Thermal Chirp Compensation By The Feedback Technique

FIGS. 15 and 16 show block diagrams for a feedback based thermal chirp compensation circuit. Two photodiodes (photodiodes #1 and #2) are used to measure the output power from the laser and the power after transmission through the OSR. The ratio of signals from photodiodes #1 and #2 is then used to create the feedback signal as follows.

The signal at photodiode #2 is proportional to the output of the CML™. The photodiodes and amplifiers are chosen to have low enough bandwidth to ensure that they do not follow the individual bit intensities, but high enough bandwidth to follow the mark density (i.e., the ratio of 1 bits to total bits) variations closely. The signal from photodiode #1 has a DC component that is proportional to the laser's average power and an AC component that follows the mark density. The signal at photodiode #1 is not affected by thermal chirp, since it measures the intensity at the output of the laser. The signal from photodiode #2, which measures the output of the OSR, has similar DC and AC components. However, the AC component of this signal is modulated by the laser's thermal chirp. This is because the frequency modulation at the output of the laser, which includes thermal chirp, produces intensity modulation after passage through the OSR. When there is negative thermal chirp, the AC component of photodiode #2 becomes smaller. The opposite occurs for positive thermal chirp. Thus, the ratio of the output of photodiode #2 to the output of photodiode #1 is proportional to the change in CML™ output amplitude induced by thermal chirp. This ratio is amplified by an amplifier of gain G, and the output fed back to adjust the bias of the laser to minimize the error.

The sign and amplitude of the amplifier gain, G, are chosen to attenuate changes in CML™ transmitter output induced by thermal chirp. The amplitude of G should be chosen to be low enough to avoid the feedback loop from oscillation. The loops shown in FIGS. 15 and 16 are proportional loops, but could also be enhanced into proportional, integrating and derivative (PID) type feedback loops.

FIG. 15 shows a feedback loop where the thermal correction signal is fed back directly to the bias circuit of the laser. Alternately, the logarithm of the thermal correction signal can be fed back as shown in FIG. 16. With the proper choice of G, feeding back the log of the signal can be as effective as direct feedback. The log feedback method can be advantageous in that there are integrated circuits that measure the modulated RF power of two electrical signals and subtract them, all on one chip. The feedback circuit acts to minimize the amplitude fluctuations (not frequency fluctuations) caused by thermal chirp, but not the thermally induced frequency fluctuations. Since the feedback circuit modulates the laser's bias current it also partially compensates for timing jitter in long optical fiber links, similar to the electrical feed-forward method described above.

Direct Thermal Compensation Technique

Another approach for thermal chirp compensation consists of keeping the laser temperature constant in the presence of strong random digital modulation. With a constant laser temperature, there is no thermal chirp.

One embodiment of this method is shown in FIG. 17, where a diode laser chip and integrated strip heater are driven with opposite modulation currents to cancel out fast temperature fluctuations in the active region of the laser. The heating power to the active region of the laser is approximately $$\text{Laser Heating Power} = R_L(I_b + G_L I_m(t))^2 + V_{active}(I_b + G_L I_m(t)) \quad \text{(Eq. 3)}$$

where $R_L$ is the laser series resistance, $V_{active}$ is the junction voltage, $I_b$ and $I_m$ are the bias and modulation currents, and $G_L$ is the modulation current gains to the laser. The heating power equation has a quadratic term for resistive heating due to parasitic resistance in the chip, and a linear term for heat created in the laser's active region. An approximate relation separating the heating power into DC and dynamic components is $$\text{Laser Heating Power} = (R_L I_b^2 + V_{active} I_b) + (2R_L I_b + V_{active}) G_L I_m(t) \quad \text{(Eq. 4)}$$

The strip heater power is $$\text{Strip Heater Power} = R_s(I_s - G_s I_m(t))^2 \approx R_s I_s^2 - 2I_s G_s I_m(t) \quad \text{(Eq. 5)}$$

where $R_s$ is series resistance for the strip heater and $G_s$ is the gain for current through the strip heater. The dynamic part of the heating can be canceled if the system parameters are arranged such that $$(2R_L I_b + V_{active}) G_L = 2I_s G_s \quad \text{(Eq. 6)}$$

The direct thermal compensation method described above is a feed-forward technique where the control occurs through the strip heater. It is also possible to construct a feedback-type system, such as in FIGS. 15 and 16, where the feedback signal is applied to the strip heater instead of the laser injection current.

Another variation of this thermal cancellation approach, shown in FIG. 18, consists of a laser with two closely-spaced active regions such that they are in intimate thermal contact. Light output is only taken from one of the two active regions; the second laser is used only to heat or cool the first laser, exactly in step with the input modulation current. The modulation currents applied to the twin lasers are made to be logical inverses of one another. For example, if the modulation current to one laser is the digital signal 1110001010, then the current supplied to its twin laser is 0001110101. This ensures that when one laser cools because of the application of a number of 0s, the other laser is being heated because of the application of the same number of 1s. Since the two active regions are in close thermal contact, the result is that both regions maintain a nearly constant temperature so that there is no net thermal chirp.

Further Constructions

It is to be understood that the present invention is by no means limited to the particular constructions herein disclosed and/or shown in the drawings, but also comprises any modifications or equivalents within the scope of the invention.

What is claimed is:

1. A fiber optic communication system for receiving an electronic digital data signal and transmitting the same, comprising:
   an optical signal source adapted to receive the electronic digital data signal and to produce a frequency modulated optical signal from a directly modulated semiconductor laser;
   an optical spectrum reshaper adapted to convert the frequency modulated optical signal into an amplitude modulated optical signal;
   a compensation apparatus for compensating for the adverse effects of the thermal chirp normally induced in the frequency modulated optical signal by modulating the semiconductor laser with the electronic digital data signal;
   wherein the compensation apparatus is adapted to modify the electronic digital data signal so as to modulate the optical source with both the original electronic digital data signal and a low pass filtered version of the original electronic digital data signal; and
   wherein the electronic digital data signal is applied to the semiconductor laser using two ports, an RF port and a low-frequency port, and further wherein the electronic digital data signal is applied to the RF port and the low-pass filtered version of the electronic digital data signal is applied to the low-frequency-port.

2. A system according to claim 1 wherein the compensation apparatus is adapted to inject additional modulating current into the semiconductor laser so as to generate additional adiabatic chirp so as to compensate for the adverse effects of thermal chirp.

3. A system according to claim 1 wherein the compensation apparatus is adapted to monitor the electronic digital data signal and inject additional modulating current into the semiconductor laser in accordance with the electronic digital data signal.

4. A system according to claim 3 wherein the additional modulating current is a function of the electronic digital data signal.

5. A system according to claim 1 wherein the compensation apparatus is adapted to maintain the temperature of an active region of the semiconductor laser independent of the mark density of the electronic digital data signal.

6. A system according to claim 1 wherein the compensation apparatus is adapted to reduce the bit error rate.

7. A system according to claim 1 wherein the compensation apparatus is adapted to reduce timing jitter over a long length of dispersive optical fiber and reduce a bit error rate at a receiver.

8. A system according to claim 1 wherein the electronic circuit comprises a resistor in series with the semiconductor laser, the combination being in parallel with a circuit of a capacitor and resistor in series.

9. A fiber optic communication system for receiving an electronic digital data signal and transmitting the same, comprising:

a directly modulated semiconductor laser having an RF port and a bias port;

an optical signal source adapted to receive the electronic digital data signal and to produce a frequency modulated optical signal from the directly modulated semiconductor laser;

an optical spectrum reshaper adapted to convert the frequency modulated optical signal into an amplitude modulated optical signal; and a compensation apparatus having a first output configured to output the electronic digital data signal and a second output configured to output an amplified and low-pass filtered version of the electronic digital data signal, the first output coupled to the RF port and the second input coupled to the bias port;

wherein the low-pass filtered version of the electronic digital data signal has a bandwidth and magnitude effective to substantially compensate for thermal chirp caused by variation in mark density of the electronic digital data signal.

* * * * *

UNITED STATES PATENT AND TRADEMARK OFFICE
CERTIFICATE OF CORRECTION

| | | |
|---|---|---|
| PATENT NO. | : 7,505,694 B2 | Page 1 of 1 |
| APPLICATION NO. | : 11/120089 | |
| DATED | : March 17, 2009 | |
| INVENTOR(S) | : Johnson et al. | |

It is certified that error appears in the above-identified patent and that said Letters Patent is hereby corrected as shown below:

Column 1
Line 29, change "claims benefit" to --claims the benefit--

Column 2
Line 1, change "1 bit" to --1 bits--
Line 50, change "1's" to --1s--

Column 3
Line 4, change "is" to --1s--
Line 51, change "compensation apparatus" to --a compensation apparatus--

Column 7
Line 15, change "than it" to --than its--

Column 8
Line 15, after "shows" remove [an]
Line 22, change "one bits" to --1 bits--

Signed and Sealed this
Twenty-second Day of February, 2011

David J. Kappos
*Director of the United States Patent and Trademark Office*